(12) United States Patent
Yamaguchi et al.

(10) Patent No.: US 10,269,670 B2
(45) Date of Patent: Apr. 23, 2019

(54) CURABLE SILICONE RESIN COMPOSITION, SILICONE RESIN COMPOSITE, PHOTOSEMICONDUCTOR LIGHT EMITTING DEVICE, LUMINAIRE AND LIQUID CRYSTAL IMAGING DEVICE

(71) Applicant: SUMITOMO OSAKA CEMENT CO., LTD., Tokyo (JP)

(72) Inventors: Takeru Yamaguchi, Tokyo (JP); Yasuyuki Kurino, Tokyo (JP); Takeshi Otsuka, Tokyo (JP); Yoichi Sato, Tokyo (JP); Kenji Harada, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/739,748

(22) PCT Filed: Jun. 22, 2016

(86) PCT No.: PCT/JP2016/068563
§ 371 (c)(1),
(2) Date: Dec. 24, 2017

(87) PCT Pub. No.: WO2016/208640
PCT Pub. Date: Dec. 29, 2016

(65) Prior Publication Data
US 2018/0323124 A1 Nov. 8, 2018

(30) Foreign Application Priority Data
Jun. 24, 2015 (JP) ................. 2015-126672

(51) Int. Cl.
*H01L 23/29* (2006.01)
*H01L 23/28* (2006.01)
(Continued)

(52) U.S. Cl.
CPC .......... *H01L 23/293* (2013.01); *B32B 27/283* (2013.01); *C08K 9/04* (2013.01);
(Continued)

(58) Field of Classification Search
CPC .................. H01L 33/52; H01L 33/56; H01L 2224/05191; H01L 2224/05291;
(Continued)

(56) References Cited

U.S. PATENT DOCUMENTS 7,985,476 B2 7/2011 Kurino et al.
9,074,101 B2 7/2015 Tsubokawa et al.
(Continued)

FOREIGN PATENT DOCUMENTS

JP 2005-200657 7/2005
JP 2009-024117 2/2009
(Continued)

OTHER PUBLICATIONS

"International Search Report (Form PCT/ISA/210) of PCT/JP2016/068563", dated Sep. 20, 2016, with English translation thereof, pp. 1-4.

*Primary Examiner* — Eduardo A Rodela
(74) *Attorney, Agent, or Firm* — JCIPRNET

(57) ABSTRACT

A curable silicone resin composition is provided, including (A) a curable silicone resin-forming component of which a viscosity is 0.02 Pa·s or greater and 100 Pa·s or less, (B) surface-modified metal oxide particles which are surface-modified by a surface-modifying material having a reactive functional group and have an average primary particle diameter of 3 nm or more and 10 nm or less, and (C) a silicone compound having a reactive functional group of which a viscosity is less than the viscosity of the (A) component and is 0.01 Pa·s or greater and 1.0 Pa·s or less and having a content of 0.1% by mass or more and 15% by
(Continued)

mass or less based on a total amount of the composition, in which a viscosity is 1.0 Pa·s or greater and 100 Pa·s or less.

7 Claims, 1 Drawing Sheet

(51) Int. Cl.
    *H01L 33/56*     (2010.01)
    *H01L 23/06*     (2006.01)
    *H01L 23/08*     (2006.01)
    *H01L 33/52*     (2010.01)
    *C08K 9/04*     (2006.01)
    *H01L 23/31*     (2006.01)
    *B32B 27/28*     (2006.01)
    *C08L 83/04*     (2006.01)

(52) U.S. Cl.
    CPC .............. *C08L 83/04* (2013.01); *H01L 23/06* (2013.01); *H01L 23/08* (2013.01); *H01L 23/28* (2013.01); *H01L 23/29* (2013.01); *H01L 23/296* (2013.01); *H01L 23/31* (2013.01); *H01L 33/52* (2013.01); *H01L 33/56* (2013.01); *B32B 2457/14* (2013.01); *B32B 2581/00* (2013.01); *C08L 2203/206* (2013.01)

(58) Field of Classification Search
    CPC ........... H01L 2224/05391; H01L 23/06; H01L 23/08; H01L 23/145; H01L 23/28; H01L 23/293; H01L 23/296
    See application file for complete search history.

(56) References Cited

U.S. PATENT DOCUMENTS

| | | | |
|---|---|---|---|
| 9,691,951 | B2 | 6/2017 | Miyamoto |
| 2009/0121180 | A1 | 5/2009 | Tsubokawa et al. |
| 2009/0140284 | A1 | 6/2009 | Kurino et al. |
| 2012/0026457 | A1* | 2/2012 | Qiu ..................... G02B 1/043 351/159.33 |
| 2015/0021643 | A1 | 1/2015 | Kurino et al. |
| 2015/0212300 | A1* | 7/2015 | Kubo ..................... G02B 1/041 359/754 |
| 2015/0221836 | A1 | 8/2015 | Kurino et al. |
| 2015/0299543 | A1 | 10/2015 | Miyamoto |
| 2016/0233395 | A1 | 8/2016 | Miyamoto |

FOREIGN PATENT DOCUMENTS

| | | |
|---|---|---|
| JP | 2009-120437 | 6/2009 |
| JP | 2009-173837 | 8/2009 |
| JP | 2011-026444 | 2/2011 |
| JP | 2011-144272 | 7/2011 |
| JP | 2013-124297 | 6/2013 |
| WO | 2007049573 | 5/2007 |
| WO | 2013133430 | 9/2013 |
| WO | 2013172476 | 11/2013 |
| WO | 2014034621 | 3/2014 |
| WO | 2014088115 | 6/2014 |
| WO | 2015056726 | 4/2015 |

* cited by examiner

CURABLE SILICONE RESIN COMPOSITION, SILICONE RESIN COMPOSITE, PHOTOSEMICONDUCTOR LIGHT EMITTING DEVICE, LUMINAIRE AND LIQUID CRYSTAL IMAGING DEVICE

CROSS-REFERENCE TO RELATED APPLICATION

This application is a 371 application of International PCT application serial no. PCT/JP2016/068563, filed on Jun. 22, 2016, which claims the priority benefit of Japan application no. 2015-126672, filed on Jun. 24, 2015. The entirety of each of the above-mentioned patent applications is hereby incorporated by reference herein and made a part of this specification.

TECHNICAL FIELD

The present invention relates to a curable silicone resin composition, a silicone resin composite, a photosemiconductor light emitting device for which the silicone resin composite is used as a sealing material, a luminaire and a liquid crystal imaging device which are equipped with the photosemiconductor light emitting device.

BACKGROUND ART

Silicone resins are excellent in terms of characteristics such as transparency, heat resistance, and light resistance and are also excellent in terms of hardness or rubber elasticity and are thus used as photosemiconductor sealing materials, optical waveguide materials, and the like. On the other hand, in spite of excellent durability, silicone resins have problems of a high coefficient of expansion, a high gas permeability (the gas barrier property is poor), a poor adhesiveness to base materials, and the like. Therefore, metal oxide particles of zirconium oxide, titanium oxide, or silicon oxide are dispersed and conjugated in silicone resin materials, thereby compensating for the above-descried defects and improving functions (for example, refer to Patent Literature 1 to 5).

CITATION LIST

Patent Literature

[Patent Literature No. 1] Japanese Laid-open Patent Publication No. 2005-200657
[Patent Literature No. 2] Japanese Laid-open Patent Publication No. 2009-24117
[Patent Literature No. 3] Japanese Laid-open Patent Publication No. 2009-120437
[Patent Literature No. 4] Japanese Laid-open Patent Publication No. 2011-26444
[Patent Literature No. 5] Japanese Laid-open Patent Publication No. 2011-144272

SUMMARY OF INVENTION

Technical Problem

However, for example, when metal oxide particles are dispersed and conjugated in a silicone resin material, the average primary particle diameter of the metal oxide particles is set to approximately 3 nm or more and 10 nm or less in order to maintain transparency, but there is a demand for dispersing and conjugating a larger number of metal oxide particles in order to improve functions, which consequently increases the viscosity due to interaction among particles having a large specific surface area and creates a problem of degradation of, particularly, the handling property.

Here, as a method for decreasing the viscosity of the composite composition of the metal oxide particles having an increased viscosity and the silicone resin material, addition of a silicone resin material having a low viscosity (low molecular weight) can be considered. However, silicone resin materials having a low viscosity easily volatilize, and thus, in the case of containing an organic solvent, silicone resin material are also removed during the removal of the organic solvent, and thus there is a problem in that the target viscosity cannot be obtained, silicone resin materials volatilize while the silicone resin material are heated and cured, and air bubbles are generated.

The present invention has been made in order to solve the above-described problem, and specifically, an object of the present invention is to provide a curable silicone resin composition and a silicone resin composite which exhibit high transparency and mechanical characteristics in the case of being used as sealing materials or the like for photosemiconductor devices, are excellent in terms of the handling property when mixed with other functional materials, injected into packages, or the like, and contain surface-modified metal oxide particles which have a volume that does not decrease or do not generate air bubbles in curing processes, a photosemiconductor light emitting device for which the silicone resin composite is used as a sealing material, and a luminaire and a liquid crystal imaging device which are equipped with the photosemiconductor light emitting device.

Solution to Problem

As a result of intensive studies for solving the above-described problem, the present inventors found that the above-described problem can be solved by blending surface-modified metal oxide particles and also blending a silicone compound having a reactive functional group and a low viscosity into a curable silicone resin during dispersion of metal oxide particles having an average primary particle diameter in a predetermined range in the silicone resin materials and obtained an idea of the present invention.

[1] A curable silicone resin composition including (A) a curable silicone resin-forming component of which a viscosity is 0.02 Pa·s or greater and 100 Pa·s or less, (B) surface-modified metal oxide particles which are surface-modified by a surface-modifying material having a reactive functional group and have an average primary particle diameter of 3 nm or more and 10 nm or less, and (C) a silicone compound having a reactive functional group of which a viscosity is less than the viscosity of the (A) component and is 0.01 Pa·s or greater and 1.0 Pa·s or less and having a content of 0.1% by mass or more and 15% by mass or less based on a total amount of the composition, in which a viscosity is 1.0 Pa·s or greater and 100 Pa·s or less.

[2] The curable silicone resin composition according to [1], in which both the surface-modifying material and the silicone compound have one or more selected from an alkenyl group and a Si—H group as the reactive functional group.

[3] The curable silicone resin composition according to [1] or [2], in which the curable silicone resin-forming component comprises (a) an alkenyl group-containing organopolysiloxane, (b) an organohydrogenpolysiloxane, and (c) a hydrosilylation catalyst.

[4] A silicone resin composite formed by curing the curable silicone resin composition according to any one of [1] to [3].

[5] A photosemiconductor light emitting device, in which a semiconductor light-emitting element is sealed with a sealing material, and the sealing material is made of the silicone resin composite according to [4].

[6] A luminaire including the photosemiconductor light emitting device according to [5].

[7] A liquid crystal imaging device including the photosemiconductor light emitting device according to [5].

Advantageous Effects of Invention

According to the present invention, it is possible to provide a curable silicone resin composition and a silicone resin composite which exhibit high transparency and mechanical characteristics in the case of being used as sealing materials or the like for photosemiconductor devices, are excellent in terms of the handling property when mixed with other functional materials, injected into packages, or the like, and contain surface-modified metal oxide particles which have a volume that does not decrease or do not generate air bubbles in curing processes, a photosemiconductor light emitting device for which the silicone resin composite is used as a sealing material, and a luminaire and a liquid crystal imaging device which are equipped with the photosemiconductor light emitting device.

DESCRIPTION OF EMBODIMENTS

Figure 1:
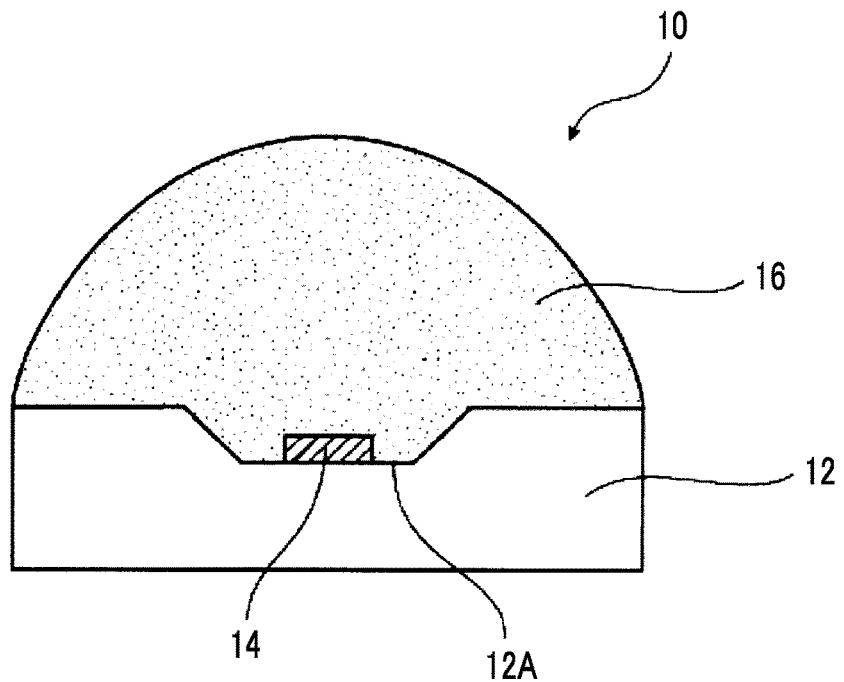
FIG. 1 is a cross-sectional view schematically illustrating an embodiment of a photosemiconductor light emitting device of the present invention.

Hereinafter, the present invention will be described in detail.

[1. Curable Silicone Resin Composition]

A curable silicone resin composition of the present invention includes (A) a curable silicone resin-forming component of which a viscosity is 0.02 Pa·s or greater and 100 Pa·s or less, (B) surface-modified metal oxide particles which are surface-modified by a surface-modifying material having a reactive functional group and have an average primary particle diameter of 3 nm or more and 10 nm or less, and (C) a silicone compound having a reactive functional group of which a viscosity is less than the viscosity of the (A) component and is 0.01 Pa·s or greater and 1.0 Pa·s or less.

Meanwhile, here, the "resin composition" is a composition which is fluid and thus has no specific shape, has an irreversible deformability and thus does not return to the original shape once deformed, and serves as a raw material of a transparent resin composite described below. Regarding the state of this resin composition, the resin composition in a liquid-form state or a thixotropic gel-form state can be indicated. In addition, the "resin-forming component" is a component for forming a resin component in the resin composite described below, ordinary examples thereof include monomers, oligomers, and prepolymers of the resin component, and additionally, a catalyst for polymerizing and curing monomers or oligomers of the resin component is also considered as the resin-forming component.

((A) Curable Silicone Resin-Forming Component)

(A) The curable silicone resin-forming component in the present invention is not particularly limited as long as the curable silicone resin-forming component is a silicone resin material that cures by heat, light, or the like, but a curable silicone resin-forming component mainly made of a portion having a structure of an organosiloxane, for example, dimethylsiloxane is preferably included. The organosiloxane is a chemically stable structure.

In addition, as the curable silicone resin-forming component, a curable silicone resin-forming component made of a structural portion containing a phenyl group, for example, a portion having a structure of methylphenylsiloxane or diphenylsiloxane may be included.

Furthermore, the curable silicone resin-forming component preferably has one or more groups selected from the group consisting of an epoxy group, a carboxyl group, a polyether group, and a carbinol group. These groups act to strengthen the bonds between the curable silicone resin-forming component and the metal oxide particles, fluorescent body particles, substrate materials, or the like.

The curable silicone resin composition preferably includes, as (A) the curable silicone resin-forming component in the present invention, (a) an alkenyl group-containing organopolysiloxane, (b) an organohydrogenpolysiloxane, and (c) a hydrosilylation catalyst. When (A) the curable silicone resin-forming component includes these components, alkenyl groups in (a) the alkenyl group-containing organopolysiloxane and Si—H groups (hydrogen group) in (b) the organohydrogenpolysiloxane are bonded to each other through an addition reaction (hydrosilylation reaction), whereby the components in the curable silicone resin-forming component are polymerized and cured together. Furthermore, when alkenyl groups or Si—H groups which are included as the reactive functional group in the surface-modifying material of the surface-modified metal oxide particles or the silicone compound having a reactive functional group are bonded to the curable silicone resin-forming component through this addition reaction (hydrosilylation reaction), it is possible to obtain silicone resin composites in which the curable silicone resin-forming component, the surface-modified metal oxide particles, and the silicone compound having a reactive functional group are integrated together.

The alkenyl group in (a) the alkenyl group-containing organopolysiloxane preferably has 1 to 20 carbon atoms and more preferably has 1 to 10 carbon atoms. Specific examples thereof include a vinyl group, an ally group, a propenyl group, an isopropenyl group, a butenyl group, an isobutenyl group, a pentenyl group, a hexenyl group, a heptenyl group, an octenyl group, a norbornenyl group, a cyclohexenyl group, and the like. Among these, a vinyl group is preferred from the viewpoint of the reactivity to the hydrosilylation reaction. In addition, it is possible to arbitrarily combine these alkenyl groups. For example, the alkenyl group may be a group in which a vinyl group and a butenyl group are disposed in one polysiloxane. In addition, a combination of a group in which a vinyl group is disposed in one polysiloxane and a group in which a butenyl group is disposed in another polysiloxane may be used.

Meanwhile, regarding the locations of the alkenyl groups in the polysiloxane, the alkenyl groups can be disposed at arbitrary locations without any particular limitation, and furthermore, two or more alkenyl groups are preferably disposed in one polysiloxane from the viewpoint of the polymerization reactivity.

In addition, the organopolysiloxane is, for example, an organopolysiloxane in which the main chain is a repeating unit of a diorganosiloxane and the terminal is a triorganosiloxane structure and may be an organopolysiloxane having a branched or cyclic structure. An organo structure bonded to silicon in the terminal or the repeating unit is, for example, a methyl group, an ethyl group, a phenyl group, or the like. Specific examples thereof include dimethylpolysiloxane having vinyl groups at both terminals.

(b) The organohydrogenpolysiloxane is an organopolysiloxane containing one or more Si—H groups (hydrogen atoms directly bonded to silicone, hydrogen groups) in at least any of a terminal and a repeating unit. From the viewpoint of the polymerization reactivity, two or more Si—H groups are preferably disposed in one polysiloxane. The organopolysiloxane is, for example, an organopolysiloxane in which the main chain is a repeating unit of a diorganosiloxane and the terminal is a triorganosiloxane structure and may be an organopolysiloxane having a branched or cyclic structure. An organo structure bonded to silicon in the terminal or the repeating unit is, for example, a methyl group, an ethyl group, phenyl, an octyl group, or the like and can also be referred to as an organo structure in which one or more of the above-described groups are substituted into hydrogen groups.

The blending ratio between (a) the alkenyl group-containing organopolysiloxane and (b) the organohydrogenpolysiloxane is, basically, preferably set so that the total number of alkenyl groups in (a) the alkenyl group-containing organopolysiloxane and the total number of Si—H groups in (b) the organohydrogenpolysiloxane become equal to each other.

More accurately, the blending ratio is preferably set so that the total number of alkenyl groups in (a) the alkenyl group-containing organopolysiloxane, the surface-modifying material of the surface-modified metal oxide particles, and the silicone compound having a reactive functional group and the total number of Si—H groups in (b) the organohydrogenpolysiloxane, the surface-modifying material of the surface-modified metal oxide particles, and the silicone compound having a reactive functional group become equal to each other. Therefore, it is preferable to determine the blending ratio between (a) the alkenyl group-containing organopolysiloxane and (b) the organohydrogenpolysiloxane in consideration of the amounts of alkenyl groups and Si—H groups in the surface-modifying material of the surface-modified metal oxide particles and the silicone compound having a reactive functional group.

Here, since S—H groups easily oxidize, at the time of actual blending (at the time of a polymerization reaction), there must be Si—H groups which oxidize and do not act as reactive groups. In addition, when excess alkenyl groups remain in a silicone resin composite that is obtained by the reaction, there is a concern that coloration may occur during thermal loading. Therefore, the total amount of Si—H groups is preferably set to approximately 1.1 to 1.2 times the total amount of alkenyl groups (that is, a state in which Si—H groups are excessive).

(c) The hydrosilylation catalyst is added to accelerate the hydrosilylation reaction between the reactive functional groups that are present in four components of the (a) component and the (b) component, and furthermore, the surface-modifying material and the silicone compound, and it is possible to use well-known metal, metallic compounds, metallic complexes, and the like which have a catalytic activity for hydrosilylation reactions. Particularly, platinum, platinum compounds, and complexes thereof are preferably used. Specific examples thereof include platinum-based hydrosilylation catalysts such as platinum, platinum black, and chloroplatinic acid, for example, $H_2PtCl_6 \cdot pH_2O$, $K_2PtCl_6$, $KHPtCl_6 \cdot pH_2O$, $K_2PtCl_4$., $K_2PtCl_4 \cdot pH_2O$, $PtO_2 \cdot pH_2O$, $PtCl_4 \cdot pH_2O$, $PtCl_2$, $H_2PtCl_4 \cdot pH_2O$ (here, p is a positive integer), and the like, complexes of the above-described hydrosilylation catalyst and a hydrocarbon such as an olefin, an alcohol, or a vinyl group-containing organopolysiloxane, and the like.

These catalysts may be used singly or two or more kinds of catalysts may be jointly used. In addition, a promoter may be jointly used. The amount of (c) the hydrosilylation catalyst blended is preferably set to 0.1 ppm or more and 100 ppm or less of the entire composition and more preferably 1 ppm or more and 50 ppm or less in order to make, particularly, a hydrosilylation reaction smoothly proceed and suppress the coloration of a silicone resin composite that is obtained by the reaction. The amount is still more preferably 5 ppm or more and 20 ppm or less.

The viscosity of (A) the curable silicone resin-forming component that is used in the present invention is 0.02 Pa·s or greater and 100 Pa·s or less. When the viscosity is below 0.02 Pa·s, materials that are conjugated with the curable silicone resin-forming component, for example, fluorescent bodies for photosemiconductor light emitting devices sink, and it becomes impossible to obtain homogeneous silicone resin composites. When the viscosity exceeds 100 Pa·s, the viscosity becomes too great, and a favorable handling property cannot be obtained even when the (C) component is blended.

The viscosity of (A) the curable silicone resin-forming component is preferably 0.02 Pa·s or greater and 50 Pa·s or less and more preferably 0.03 Pa·s or greater and 10 Pa·s or less.

((B) Surface-Modified Metal Oxide Particles)

(B) The surface-modified metal oxide particles in the present invention are formed by surface-modifying metal oxide particles having a specific particle diameter with a surface-modifying material having a reactive functional group.

(Metal Oxide Particles)

The kind of the metal oxide particles is not particularly limited; however, for the purpose of improving or adjusting the optical characteristics, mechanical characteristics, thermal characteristics, and the like of the silicone resin composite described below, a preferred metal oxide is appropriately selected from zinc oxide, zirconium oxide, titanium oxide, silicon dioxide (silica), aluminum oxide, cerium oxide, and the like. In addition, in a case in which an increase in brightness by increasing the refractive index of a sealing material or the like and thus improving the light extraction efficiency from a photosemiconductor light emitting device in which the sealing material is used or the color rendering property is taken into account, the refractive index of the metal oxide particles is preferably 1.5 or more, more preferably 1.7 or more, and still more preferably 1.9 or more. For the above-described metal oxide particles, titanium oxide or zirconium oxide (zirconia) is preferred, and zirconia is particularly preferred.

The average primary particle diameter of the metal oxide particles is 3 nm or more and 10 nm or less. When the average primary particle diameter is less than 3 nm, the crystallinity becomes poor, additionally, the surface activity is strong, and the particles interact with one another and thus the viscosity of the curable silicone resin composition excessively increases. Therefore, the viscosity does not sufficiently decrease even when the (C) component is blended, and a favorable handling property cannot be obtained. On the other hand, when the average primary particle diameter becomes larger than 10 nm, the refractive index difference between the metal oxide and a silicone resin including the surface-modifying material is great, and thus the transmittance significantly decreases due to scattering.

The average primary particle diameter is preferably 4 nm or more and 8 nm or less and more preferably 4 nm or more and 6 nm or less.

(Surface-Modifying Material)

The surface-modifying material that is used for the surface modification of the metal oxide particles contains a reactive functional group. The reactive functional group is not particularly limited as long as the reactive functional group reacts with the surfaces of the metal oxide particles or functional groups in the curable silicone resin-forming component, but an alkenyl group that causes an addition reaction with the S—H group of the organohydrogenpolysiloxane in the curable silicone resin-forming component through hydrosilylation or a Si—H group that causes an addition reaction with the alkenyl group of the alkenyl group-containing organopolysiloxane through hydrosilylation is preferably used. If the reactive functional group is the above-described reactive functional group, when a metal oxide particle-containing silicone resin composition is cured and thus turned into a composite, the reactive functional group in the surface-modifying material, the (A) component, and the reactive functional group in the (C) component cause an addition reaction, and thus the metal oxide particles and a silicone resin are integrally fixed to each other. Therefore, the metal oxide particles do not agglomerate, and transparent silicone resin composites can be obtained. In addition, the metal oxide particles and the silicone resin are cross-linked with one another, whereby the mechanical characteristics of the silicone resin composites improve.

In addition, for the purpose of uniformly dispersing and stabilizing a surface-modified metal oxide particle material in silicone resin composites or compositions, a surface-modifying material having a different structure may be jointly used.

Meanwhile, as the surface-modifying material, specifically, it is possible to use a dimethyl silicone resin, a phenyl group-containing silicone resin, an alkoxy group-containing methylphenyl silicone resin, a silane coupling agent, or the like. Among these, an alkoxy group-containing methylphenyl silicone resin is preferred.

A surface-modifying material containing an alkenyl group is not particularly limited as long as the surface-modifying material contains an alkenyl group in the structure, and examples thereof include materials having a structure represented by Expression (1) or (2).

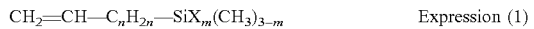
$$CH_2=CH-C_nH_{2n}-SiX_m(CH_3)_{3-m} \quad \text{Expression (1)}$$

(In Expression (1), n is an integer of 0 or more, and m is an integer of 1 to 3. X is selected from a methoxy group, an ethoxy group, a hydroxyl group, a halogen atom, and a carboxyl group, and, in a case in which m is 2 or more, all of X's may be equal to or different from each other.)

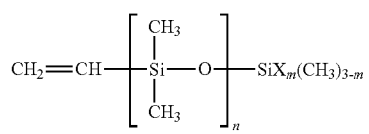

Expression (2)

(In Expression (2), n is an integer of 1 to 100, and m is an integer of 1 to 3. X is selected from a methoxy group, an ethoxy group, a hydroxyl group, a halogen atom, and a carboxyl group, and, in a case in which m is 2 or more, all of X's may be equal to or different from each other.)

Specific examples of the surface-modifying material containing an alkenyl group include vinyl trimethoxysilane, vinyl triethoxysilane and one alkoxy-terminated one vinyl-terminated dimethyl silicone. Additionally, examples of the surface-modifying material containing an alkenyl group include materials having a structure in which the hydrocarbon chain in Expression (1) is branched or a structure in which an alkenyl group is contained on a branched hydrocarbon chain, acrylic silane coupling agents such as methacryloxypropyltrimethoxysilane and acryloxypropyltrimethoxysilane, carbon-carbon unsaturated bond-containing aliphatic acids such as methacrylic acid, and the like.

Among these, from the viewpoint of excellent thermal resistance, vinyl trimethoxysilane, one alkoxy-terminated one vinyl-terminated dimethyl silicone, and materials having a structure in which the hydrocarbon chain in Expression (1) is branched or a structure in which an alkenyl group is contained on a branched hydrocarbon chain are preferred.

Furthermore, the surface-modifying material may be a surface-modifying material containing not only an alkenyl group but also a phenyl group, such a surface-modifying material is not particularly limited as long as the surface-modifying material contains both a phenyl group and an alkenyl group in the structure, and examples thereof include styrylmethoxysilane, one alkoxy-terminated one vinyl-terminated phenyl silicone represented by Expression (3), one alkoxy-terminated one vinyl-terminated methylphenyl silicone, and the like. All of these surface-modifying materials are also excellent in terms of thermal resistance.

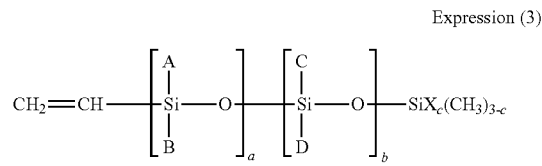

Expression (3)

(In Expression (3), a is an integer of 1 to 100, b is an integer of 0 to 100, and c is an integer of 1 to 3. At least one of A, B, C, and D is a phenyl group, and the others are alkyl groups having 1 to 6 carbon atoms. A, B, C, and D may be all phenyl groups. X is selected from a methoxy group, an ethoxy group, a hydroxyl group, a halogen atom, and a carboxyl group, and, in a case in which c is 2 or more, all of X's may be equal to or different from each other.)

Meanwhile, a surface-modifying material having a Si—H group is not particularly limited as long as the surface-modifying material contains a hydrogen atom directly bonded to silicon (hydrogen group) in the structure, and examples thereof include materials having a structure represented by Expression (4) or (5).

$$(C_yH_{2y-1})_nSiH_mX_{4-n-m} \quad \text{Expression (4)}$$

(In Expression (4), y is an integer from 1 to 6, n and m are 1 or 2, and the sum of n and m is 3 or less. X is selected from a methoxy group, an ethoxy group, a hydroxyl group, a halogen atom, and a carboxyl group, and, in a case in which 4−n−m is 2 (in the case of n=m=1), two X's may be equal to or different from each other.)

Expression (5)

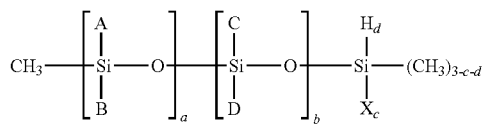

(In Expression (5), a is an integer of 1 to 100, and b is an integer of 0 to 100. A, B, C, and D are one or more selected from a phenyl group, an alkyl group having 1 to 6 carbon atoms, or a halogen group, and A, B, C, and D may be equal to or different from one another. In addition, the location and array of a portion constituted of Si.A.B.O, and a portion constituted of Si.C.D.O are arbitrary and are random polymer types. X is selected from a methoxy group, an ethoxy group, a hydroxyl group, a halogen atom, and a carboxyl group, and, in a case in which c is 2 or more, all of X's may be equal to or different from each other. In a case in which at least one of A, B, C, and D is a hydrogen group, c is an integer of 1 to 3, d is an integer of 0 to 2, and the sum of c and d is 3 or less, and, in a case in which none of A, B, C, and D include a hydrogen group, c and d are 1 or 2 and the sum of c and d is 3 or less.)

Specific examples thereof include trimethoxysilane, dimethylethoxysilane, diethoxymethylsilane, dimethylchlorosilane, ethyldichlorosilane, phenyldichlorosilane, diphenylchlorosilane, phenylchlorosilane, phenyldiethoxysilane, and the like.

Among these, from the viewpoint of excellent thermal resistance, triethoxysilane, dimethylethoxysilane, and diethoxymethylsilane are preferred.

Except for the above-described surface-modifying materials, as the surface-modifying material in the present invention, it is possible to use ethyltriethoxysilane, propyltriethoxysilane, isobutyltriethoxysilane, and the like.

Furthermore, examples of a surface-modifying material having the different structure which is jointly used for the purpose of uniformly dispersing and stabilizing the metal oxide particles in the silicone resin composition or the silicone resin composite described below include one alkoxy-terminated dimethyl silicone, one alkoxy-terminated one vinyl-terminated dimethyl silicone, one terminated epoxy silicone, alkylsilane compounds, aliphatic acid compounds, and the like.

Examples of a method for surface-modifying the metal oxide particles using the surface-modifying material include wet-type methods, dry-type methods, and the like. Examples of the wet-type methods include a method in which the metal oxide particles, the surface-modifying material, and, as necessary, a catalyst for hydrolyzing the surface-modifying material are injected into a solvent, and the metal oxide particles are surface-modified and dispersed in the solvent by adding energy from the outside by means of heating and stirring, beads media, or the like. In addition, examples of the dry-type methods include a method in which surface-modified metal oxide particles are obtained while mixing the metal oxide particles and the surface-modifying material using a stirrer or the like.

The surface modification amount (the surface-modifying material/the metal oxide particles) of the surface-modifying material to the metal oxide particles is preferably 5% by mass or more and 40% by mass or less. When the surface modification amount is in this range, it is possible to maintain a high dispersibility of a surface-modified metal oxide particle material in the curable silicone resin composition, and consequently, it is possible to maintain a high dispersibility of the surface-modified metal oxide particle material in the silicone resin composite described below, and thus it is possible to suppress the degradation of the transparency or the gas permeability.

The surface modification amount is more preferably 10% by mass or more and 30% by mass or less.

Meanwhile, in the present invention, the content of the surface-modified metal oxide particles is preferably 10% by mass or more and 75% by mass or less based on the total amount of the curable silicone resin composition. When the content is less than 10% by mass, the content of the surface-modified metal oxide particles is small, and thus the viscosity of the curable silicone resin composition does not become excessively high, and it does not become necessary to blend the (C) component. In addition, the amount of the metal oxide particles is small, and thus there is a possibility that the effect of the addition of the metal oxide particles may not be exhibited. On the other hand, when the content is more than 75% by mass, it becomes difficult to set to the viscosity of the curable silicone resin composition to 100 Pa·s or less even when the (C) component is blended.

The content of the surface-modified metal oxide particles is preferably set to 20% by mass or more and 75% by mass or less and more preferably set to 40% by mass or more and 70% by mass or less.

((C) Silicone Compound Having Reactive Functional Group)

(C) The silicone compound having a reactive functional group in the present invention (hereinafter, in some cases, referred to as "silicone compound") has a viscosity that is less than the viscosity of the (A) component and is 0.01 Pa·s or greater and 1.0 Pa·s or less.

In the silicone compound, the viscosity is less than the viscosity of the (A) component and is 0.01 Pa·s or greater and 1.0 Pa·s or less in order to set the viscosity of the curable silicone resin composition in which the (A) to (C) components are mixed together to 100 Pa·s or less. First, when the viscosity is not less than the viscosity of the (A) component, it is not possible to decrease the viscosity even when the (C) component is blended. Here, when the viscosity is below 0.01 Pa·s, the degree of polymerization of the silicone compound is small, and thus, during the heating and drying or a reduced-pressure drying treatment step of an organic solvent in a case in which the organic solvent is included in the curable silicone resin composition, the silicone compound is volatilized and removed from the composition together with the organic solvent or the silicone compound is volatilized while being heated in order to conjugate the composition and air bubbles are generated in the silicone resin composite. In addition, when the viscosity is greater than 1.0 Pa·s, the viscosity of the curable silicone resin composition containing a significant amount of fine metal oxide particles having an average primary particle diameter of 3 nm or more and 10 nm or less exceeds 100 Pa·s even when the (C) component is blended, and the handling property becomes poor.

Regarding the viscosity of the silicone compound, the viscosity is preferably 0.01 Pa·s or greater and 0.8 Pa·s or less and more preferably 0.01 Pa·s or greater and 0.5 Pa·s or less.

The reactive functional group in the silicone compound is not particularly limited as long as the reactive functional group reacts with the functional group of the surface-modifying material on the surfaces of the metal oxide particles or the functional groups in the curable silicone resin-forming component, but is preferably, similar to the reactive functional group in the surface-modifying material, a Si—H group or an alkenyl group.

That is, when an alkenyl group that causes an addition reaction with the Si—H group of the organohydrogenpolysiloxane in the curable silicone resin-forming component through hydrosilylation or a Si—H group that causes an addition reaction with the alkenyl group of the alkenyl group-containing organopolysiloxane through hydrosilylation is used as the reactive functional group, there is an action of decreasing the viscosity of the curable silicone resin composition, and, when the composition is cured and turned into a composite, the reactive functional group causes an addition reaction with the reactive functional groups in the (A) component and the (B) component, and thus the reactive groups can be integrated together as a composite, and there is no case in which the reactive functional group is volatilized during heating for conjugation and air bubbles are generated. Meanwhile, from the viewpoint of imparting non-volatility to the silicone compound, the number of the reactive functional groups in one molecule of the silicone compound may be one; however, from the viewpoint of increasing the number of crosslinking points that subsequently appear, two or more reactive functional groups are preferably disposed in one molecule. In addition, since (C) the silicone compound increases the number of crosslinking points in the curable silicone resin composition, agglomeration of the metal oxide particles is further suppressed, and more transparent silicone resin composites can be obtained. Furthermore, the number of crosslinking points between the metal oxide particles and the silicone resin increases, and thus the mechanical characteristics of the composites further improve.

Examples of the silicone compound having the reactive functional group in the present invention include hydrogen-terminated polydimethylsiloxane, methylhydrosiloxane-dimethylsiloxane copolymers, polyethylhydrosiloxane, polyphenyl-(dimethylhydrosiloxane)siloxane, methylhydrosiloxane-phenylmethylsiloxane copolymers, methylhydrosiloxane-octylmethylsiloxane copolymers, vinyl-terminated polydimethylsiloxane, vinyl-terminated diphenylsiloxane-dimethylsiloxane copolymers, vinyl-terminated polyphenylmethylsiloxane, vinylphenylmethyl-terminated vinylphenylsiloxane-phenylmethylsiloxane copolymers, vinyl-terminated trifluoropropylmethylsiloxane-dimethylsiloxane copolymers, and the like.

In addition, in the present invention, the content of the silicone compound needs to be set to 0.1% by mass or more and 15% by mass or less based on the total amount of the curable silicone resin composition. When the content is less than 0.1% by mass, it is not possible to sufficiently decrease the viscosity of the curable silicone resin composition, and, when the content is more than 15%, by mass, the number of crosslinking points excessively increases, and thus silicone resin composites become excessively hard, and cracks are generated due to mechanical and thermal impacts.

The content of the silicone compound is preferably set to 0.1% by mass or more and 14% by mass or less, more preferably set to 0.3% by mass or more and 12% by mass or less, and still more preferably set to 0.5% by mass or more and 10% by mass or less.

As described above, the curable silicone resin composition of the present invention contains the (A) component, the (B) component, and the (C) component, and the content of the silicone compound which is the (C) component is 0.1% by mass or more and 15% by mass or less based on the total weight of the composition. Furthermore, the content of the surface-modified metal oxide particles which are the (B) component is preferably 10% by mass or more and 75% by mass or less based on the total amount of the curable silicone resin composition. As described above, in the curable silicone resin composition of the present invention, it is possible to set the viscosity to 1.0 Pa·s or greater and 100 Pa·s or less by adjusting the characteristics and contents of the (A) component, the (B) component, and the (C) component. When the viscosity is set to 1.0 Pa·s or greater and 100 Pa·s or less, it is possible to obtain curable silicone resin compositions in which the handling property for mixing with fluorescent bodies or injection into packages is excellent and, in curing processes, the volume does not decrease or air bubbles are not generated.

The viscosity of the curable silicone resin composition is preferably set to 2.0 Pa·s or greater and 50 Pa·s or less and more preferably set to 5.0 Pa·s or greater and 30 Pa·s or less.

[2. Silicone Resin Composite]

A silicone resin composite of the present invention is obtained by polymerizing and curing the curable silicone resin composition of the present invention through an addition reaction, a condensation reaction, or the like.

Here, the addition reaction refers to, for example, a reaction in which alkenyl groups and Si—H groups are bonded to each other using a platinum-group metal-based catalyst (hydrosilylation reaction). In this addition reaction, for example, alkenyl groups disposed in a polysiloxane and Si—H groups disposed in another polysiloxane are bonded to each other through an addition reaction and are polymerized and cured.

In addition, the condensation reaction refers to, for example, a reaction in which a hydroxyl group or a hydrolyzable group and a hydrolyzable group cause a reaction such as dehydration through a condensation catalyst containing an aminooxy group, an amino group, a ketoxime group, or the like and are bonded to each other. In this condensation reaction, for example, a hydroxyl group or a hydrolyzable group disposed at a polysiloxane terminal and a hydrolyzable group bonded to a silicon atom in a silane compound are bonded to each other through a condensation reaction such as dehydration and are polymerized and cured.

For the polymerization and curing of the curable silicone resin composition of the present invention, any of the addition reaction and the condensation reaction can be selected. However, in the case of the condensation reaction, byproducts such as water are generated, and, when the fact that the influence of these byproducts needs to be considered, it becomes necessary to remove the byproducts, and the reaction is a polymerization reaction in which not only the silicone resin-forming component but also the surface-modified metal oxide particles (surface-modifying material) or the silicone compound having the reactive functional group are included is taken into account, polymerization and curing by the addition reaction is preferably selected.

In the curable silicone resin composition of the present invention, as alkenyl groups, the alkenyl groups disposed in the polysiloxane in the silicone resin-forming component which is the (A) component, the alkenyl groups as the reactive functional group in the surface-modifying material of the surface-modified metal oxide particles which are the (B) component, and the alkenyl groups as the reactive functional group in the silicone compound having a reactive functional group which is the (C) component are present. In addition, as Si—H groups, the Si—H groups disposed in the polysiloxane in the silicone resin-forming component which is the (A) component, the Si—H groups as the reactive functional group in the surface-modifying material of the surface-modified metal oxide particles which are the (B)

component, and the Si—H groups as the reactive functional group in the silicone compound having a reactive functional group which is the (C) component are present. Therefore, in the polymerization and curing by the addition reaction, not only bonds between the polysiloxanes but also bonds between the polysiloxanes and the surface-modifying material (surface-modified metal oxide particles), bonds between the polysiloxanes and the silicone compound, bonds between the surface-modifying material (surface-modified metal oxide particles) and the silicone compound, and the like are generated, and thus it is possible to polymerize and cure the curable silicone resin composition.

As described above, in the curable silicone resin composition of the present invention, the respective components of the (A) component, the (B) component, and the (C) component are bonded to one another, thereby polymerizing and curing the curable silicone resin composition, and thus the phase separation of the surface-modified metal oxide particles and the curable silicone resin-forming component in the curing process is prevented, and it is possible to prevent the generation of air bubbles by the volatilization of the silicone compound and the like.

Furthermore, the silicone compound is crosslinking-bonded to the curable silicone resin-forming component and the surface-modified metal oxide particles, whereby the number of crosslinking points between the metal oxide particles and the silicone resin increases. Due to this increase in the number of crosslinking points, agglomeration of the metal oxide particles in the curing process is further suppressed, and thus silicone resin composites having a higher transparency can be obtained.

In addition, in the obtained silicone resin composite of the present invention, the number of crosslinking points between the metal oxide particles and the silicone resin increases, and thus the metal oxide particles and the silicone resin are strongly integrated together. Therefore, the mechanical characteristics of the resin composite further improve, and agglomeration of the metal oxide particles (the degradation of particle dispersibility) during thermal loading is suppressed, and thus a decrease in the transmittance is also suppressed.

Furthermore, the silicone resin composite includes the metal oxide particles, and the metal oxide particles and the silicone resin are strongly integrated together, and thus it is also possible to impart a high gas barrier property.

Meanwhile, here, the "resin composite" has a specific shape, but "having a predetermined shape" means that the resin composite does not have any irreversible deformability such as a liquid form or a gel form and is capable of maintaining a constant shape suitable for intended uses or methods. That is, the resin composite may have, in addition to a solid form that, generally, rarely deforms, an elastic deformability (shape restorability) such as a rubber form, and the shape does not need to be a specific shape.

The shape of the silicone resin composite is not particularly limited, and the shape may be selected depending on uses. Here, the silicone resin that is used in the present invention does not exhibit thermal plasticity or solvent solubility that is exhibited by ordinary resins after being polymerized and cured through the addition reaction or the condensation reaction. Therefore, the silicone resin composite is preferably molded when the silicone resin composite is produced by curing the curable silicone resin composition or molded by means of mechanical processing such as cutting of the cured silicone resin composite. Here, a case in which the silicone resin composite is molded when the silicone resin composite is produced by curing the curable silicone resin composition will be described.

First, the curable silicone resin composition of the present invention is molded using a die or a mold form or is infilled into a die or mold form-shaped container, thereby obtaining a compact or infill that is molded into a target shape. At this point in time, the compact or infill is in a fluid state.

Here, the viscosity of the curable silicone resin composition being used is set to 1.0 Pa·s or greater and 100 Pa·s or less by adjusting the amount of the (C) component blended and, furthermore, adjusting the amount of the (B) component blended as necessary, and thus the curable silicone resin composition has an excellent handling property and can be easily molded or infilled.

However, in a case in which the viscosity of the curable silicone resin composition being used is still high, the viscosity may be adjusted to a viscosity suitable for molding or infilling by adding, stirring, and mixing an organic solvent or the like in advance so as to decrease the viscosity.

In addition, in a case in which the viscosity of the curable silicone resin composition being used is low, the viscosity may be adjusted to a viscosity more suitable for molding or infilling by polymerizing or crosslinking a part of the curable silicone resin-forming component, a part of the curable silicone resin-forming component and the surface-modifying material, a part of the curable silicone resin-forming component and the silicone compound, or the like so as to increase the viscosity. In addition, in a case in which the curable silicone resin composition includes an organic solvent, it is also possible to increase the viscosity by removing part or all of the organic solvent by means of volatilization or the like. Furthermore, the curable silicone resin composition may also be used in a master batch form after being mixed with other resins.

Next, this compact or infill is left to stand for a predetermined time at room temperature (approximately 25° C.) and after being heated to a predetermined temperature (room temperature to 150° C. and preferably 80° C. to 150° C.) or this compact or infill is irradiated with an electron beam or a light ray (active energy ray) having an arbitrary wavelength in the ultraviolet range, thereby polymerizing and curing the curable silicone resin-forming component and the like in the curable silicone resin composition through the addition reaction, the condensation reaction, or the like. Here, as described above, the curable silicone resin-forming component, the surface-modifying material of the surface-modified metal oxide particles, and the silicone compound react with one another and are bonded together, and thus the phase separation of the surface-modified metal oxide particles and a curable silicone resin in the curing process is prevented, and it is possible to prevent the generation of air bubbles or the like caused by the volatilization of the silicone compound. Furthermore, since the number of crosslinking points between the metal oxide particles and the silicone resin is increased by the silicone compound, it is possible to obtain silicone resin composites in which the transparency is higher, the mechanical characteristics improve, a decrease in the transmittance during thermal loading is also suppressed, and the gas barrier property is also high.

Meanwhile, in a case in which the organic solvent remains in the compact or infill, it is preferable to volatilize and remove this organic solvent in advance.

As a result, the compact or infill in a state of being capable of maintaining a constant state even under the application of an external force after being removed from the die or the container, that is, a silicone resin composite can be obtained.

Meanwhile, the silicone resin composite does not necessarily need to be removed from the die or the container as long as there is no problem with uses. For example, in a photosemiconductor light emitting device described below, the device itself forms a container.

In a case in which the silicone resin composite of the present invention is used as a sealing material for photosemiconductor light emitting devices and the like, the refractive index is preferably higher than 1.54, more preferably 1.56 or higher, still more preferably 1.58 or higher, and most preferably 1.6 or higher. In addition, the transmittance at a wavelength of 400 to 800 nm in a case in which the light path length is set to 1.0 mm is preferably 60% or higher and more preferably 70% or higher. When the transmittance is in this range, the silicone resin composite is capable of maintaining a high transparency even when, for example, directly coating a photosemiconductor element and is capable of suppressing a decrease in light transmission loss as a constituent member.

The refractive index or transmittance of the silicone resin composite can be set in desired ranges by appropriately adjusting the kind or particle diameters of the metal oxide particles, the composition of a matrix silicone resin, the amount of the metal oxide particles in the silicone resin composite, and the like.

For example, in order to increase the refractive index of the silicone resin composite, high-refractive-index particles having a refractive index of 1.5 or higher are preferably used as the metal oxide particles. The refractive index is more preferably 1.7 or higher and still more preferably 1.9 or higher. As such metal oxide particles, it is possible to select metal oxide particles containing one or more kinds selected from the group of zirconium, titanium, tin, cerium, tantalum, niobium, and zinc, and, among these, titanium oxide or zirconium oxide (zirconia) is preferred, and zirconia is particularly preferred. In addition, it is also possible to increase the refractive index of the resin by introducing a phenyl group into the silicone resin.

Meanwhile, the refractive index of the silicone resin composite can be obtained by using a (1 mm-thick) composite formed on an aluminum substrate and measuring the value at a wavelength of 594 nm at room temperature using a prism coupler. A method for measuring the transmittance will be described below.

The use of the silicone resin composite of the present invention is not particularly limited. Particularly, the silicone resin composite can be preferably used as optical components and the like in which the above-described excellent characteristics of the silicone resin composite are used. Examples of optically functional devices including such an optical component include photosemiconductor light emitting devices which will be described in the following section, a variety of display devices (liquid crystal displays, plasma displays, and the like), a variety of projector devices (OHP, liquid crystal projectors, and the like), optical fiber communication devices (optical waveguides, optical amplifiers, and the like), photographing devices such as cameras or videos, luminaires such as LED lighting devices, and the like.

[3. Photosemiconductor Light Emitting Device]

In a photosemiconductor light emitting device of the present invention, a semiconductor light-emitting element is sealed with a sealing material, and the sealing material is made of the silicone resin composite of the present invention.

In the silicone resin composite of the present invention, the generation of air bubble or the like during curing is prevented, the transparency is high, the mechanical characteristics improve, a decrease in the transmittance during thermal loading is also suppressed, and the gas barrier property is also favorable. In addition, the refractive index of the silicone resin composite can be increased by using high-refractive-index particles having a refractive index of 1.5 or higher as the metal oxide particles. Due to these characteristics, the silicone resin composite can be preferably used as sealing materials for photosemiconductor light emitting devices.

Meanwhile, the thickness of a sealing layer made of the sealing material is preferably 50 μm or more. When the thickness of the sealing layer is less than 50 μm, there are cases in which it is not possible to sufficiently suppress the gas permeability at a low level. The thickness of the sealing layer is preferably 100 μm or more and more preferably 200 μm or more.

Regarding the constitution of the sealing layer according to the present invention, the entire sealing layer in the photosemiconductor light emitting device may be a layer of the silicone resin composite of the present invention (first aspect) or a layer in which a part of the sealing layer in the photosemiconductor light emitting device is a layer of the silicone resin composite of the present invention and the other sealing layers are stacked (second aspect). In addition, these sealing layers may also contain a fluorescent body.

Since the photosemiconductor light emitting device of the present invention is excellent in terms of the gas barrier property of the sealing layer as described above, it is possible to suppress the deterioration of silver-plated reflection plates in, for example, LED packages and diminish a decrease of the brightness of LED while maintaining the brightness at a high level, and thus the photosemiconductor light emitting device can be effectively used as luminaires or liquid crystal imaging devices including the photosemiconductor light emitting device.

The photosemiconductor light emitting device will be specifically described. Meanwhile, the present invention is not limited to the following example.

In a first aspect (light emitting device 10) according to the present invention, as illustrated in FIG. 1, a light-emitting element 14 is disposed in a recess portion 12A of a reflection cup 12, and a first sealing layer 16 constituted of a sealing material made of the silicone resin composite of the present invention is formed so as to come into contact with the light-emitting element 14 and fill the recess portion.

According to such a device, light ejected from the light-emitting element 14 passes through a boundary surface with the sealing material, passes through the inside of the sealing material, and is extracted to the outside directly or by being reflected by a wall surface of the reflection cup 12.

Examples of the light-emitting element constituting the light emitting device include light emitting diodes (LEDs) and semiconductor lasers. Here, as the light emitting diode, a red light emitting diode emitting red light (for example, light having a wavelength of 640 nm), a green light emitting diode emitting green light (for example, light having a wavelength of 530 nm), and a blue light emitting diode emitting blue light (for example, light having a wavelength of 450 nm) can be exemplified. The light emitting diode may have a so-called face up structure or may have a flip chip structure. That is, the light emitting diode is constituted of a substrate and a light emitting layer formed on the substrate and may have a structure in which light is ejected to the outside from the light emitting layer or may have a structure in which light from the light emitting layer passes through the substrate and is ejected to the outside.

More specifically, the light emitting diode has a structure in which, for example, a first clad layer which is formed on a substrate and is made of a first conduction-type (for example, n-type) compound semiconductor layer, an active layer formed on the first clad layer, a second clad layer which is formed on the active layer and is made of a second conduction-type (for example, p-type) compound semiconductor layer are stacked together and includes a first electrode electrically connected to the first clad layer and a second electrode electrically connected to the second clad layer. The layers constituting the light emitting diode are dependent on light emitting wavelengths and may be constituted of a well-known compound semiconductor material.

Here, regarding the refractive index of the light emitting layer in the light emitting diode, for example, the refractive index of a GaAs-based light emitting layer is approximately 3.5, the refractive index of a GaP-based light emitting layer is approximately 3.2, the refractive index of a GaN-based light emitting layer is approximately 2.5, and the refractive index of a sapphire substrate which is ordinarily used is approximately 1.75, which shows the refractive index is significantly high in all cases. However, the refractive indexes of sealing materials such as silicone resin-based sealing materials or epoxy resin-based sealing materials which have been used in the related art are at most approximately 1.4 to 1.5, and the refractive index difference between a light emitting layer and the sealing material or between a sapphire substrate and the sealing material is great, and thus a majority of light from a light emitting layer is mirror-reflected on the interface therebetween and is confined in the light emitting layer or the sapphire substrate, and it is not possible to increase the extraction efficiency of light.

In the photosemiconductor light emitting device of the present invention, the silicone resin composite is used as the sealing material, and the metal oxide particles having a high refractive index are used in the resin composite, and thus it is possible to easily increase the refractive index of the silicone resin composite. Meanwhile, as high-refractive-index metal oxide particles, it is possible to select metal oxide particles containing one or more kinds selected from the group of zirconium, titanium, tin, cerium, tantalum, niobium, and zinc, and, among these, titanium oxide or zirconium oxide (zirconia) is preferred, and zirconia is particularly preferred.

As described above, when the refractive index of the silicone resin composite which is the sealing material is increased, the amount of emitted light that is mirror-reflected between the light emitting layer and the sealing material or between the sapphire substrate and the sealing material is decreased, and thus it is possible to increase the extraction efficiency of light. The refractive index of the sealing material is preferably higher than 1.54, more preferably 1.56 or higher, still more preferably 1.58 or higher, and most preferably 1.6 or higher.

In addition, regarding the transmittance of the sealing material such as silicone resin-based sealing materials or epoxy resin-based sealing materials which have been used in the related art, the transmittance at a wavelength of 450 nm in a case in which the light path length is set to 0.5 mm is preferably 40% or higher, more preferably 60% or higher, and still more preferably 70% or higher.

In the photosemiconductor light emitting device of the present invention, the silicone resin composite of the present invention is used as the sealing material, and it is possible to easily set the transmittance of the resin composite at a wavelength of 400 to 800 nm in a case in which the light path length is set to 1.0 mm to 60% or higher due to the constitution, and thus, surely, it is possible to increase the extraction efficiency of light.

Figure 2:
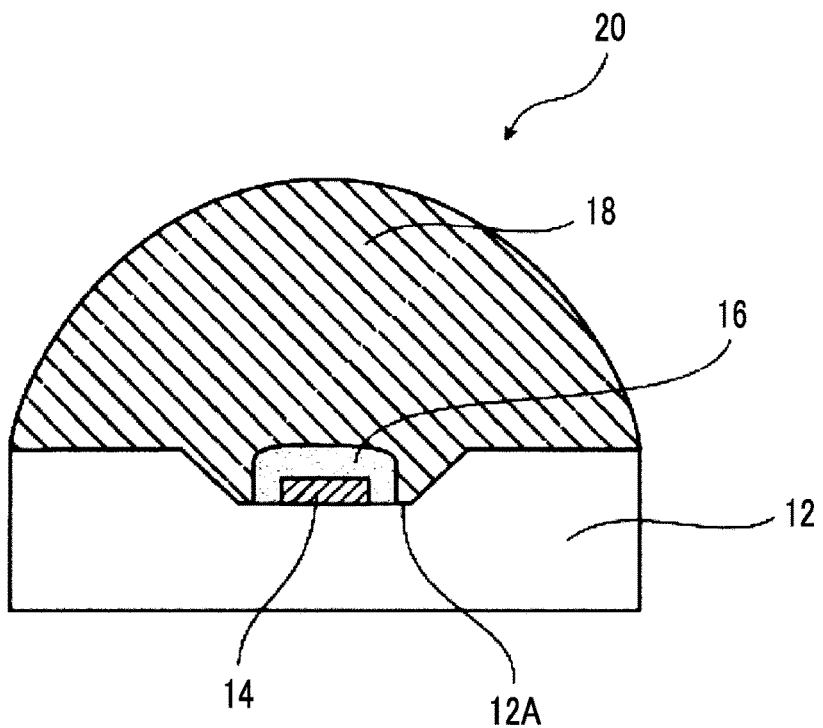
FIG. 2 is a cross-sectional view schematically illustrating another embodiment of the photosemiconductor light emitting device of the present invention.

A second aspect (light emitting device 20) according to the present invention is the same as the first aspect except for the fact that a first sealing layer 16 is formed so as to cover the surface of the light-emitting element 14 and a second sealing layer 18 is formed on the outside of the first sealing layer as illustrated in FIG. 2.

The second sealing layer 18 may be a layer provided in order to compensate for characteristics which lack in the first sealing layer 16 or may be a layer provided in order to decrease interface reflection on the surface of the first sealing layer 16 (the interface with the outside) so as to increase the extraction efficiency of light. Meanwhile, in a case in which a decrease in interface reflection is intended, the refractive index of the second sealing layer 18 is preferably set to a value which is less than the refractive index of the first sealing layer 16 and exceeds one (the refractive index of the atmosphere).

Examples of a material of the second sealing layer 18 include methylsilicone, modified silicone, a variety of resins such as acrylic resins, epoxy resins, and polyimide resins, and resin composites. In addition, the silicone resin composite of the present invention may be used, and, in this case, it is preferable to impart characteristics or a refractive index which are different from those of the first sealing layer 16 by adjusting the components or blending ratio of the curable silicone resin-forming component, the surface-modified metal oxide particles, and the silicone compound which serve as raw materials. Furthermore, for the purpose of adjusting the refractive index of the second sealing layer 18, the second sealing layer may contain the surface-modified metal oxide particles according to the present invention.

In addition, the photosemiconductor light emitting device of the present invention can be a photosemiconductor light emitting device in which a light-emitting element and a fluorescent body are combined together. According to the photosemiconductor light emitting device of the present invention, the first sealing layer in contact with a photo-semiconductor element is the silicone resin composite of the present invention described above, but the above-described photosemiconductor light emitting device can be obtained by adding, for example, a fluorescent body such as an YAG fluorescent body for blue InGaN or an RGB fluorescent body for ultraviolet light to the first sealing layer. This fluorescent body may be added in advance to a curable silicone resin composition for forming the silicone resin composite which is the sealing material of the present invention (a fluid including at least the curable silicone resin-forming component, the surface-modified metal oxide particles, and the silicone compound having a reactive group), and examples of a method therefor include a method in which a fluorescent body is directly mixed into the curable silicone resin composition during the production of the curable silicone resin composition, a method in which a fluorescent body is mixed into a non-cured curable silicone resin, a method in which a dispersion liquid having a fluorescent body dispersed in an organic solvent or the like is mixed into the curable silicone resin composition and then the organic solvent or the like is removed, and the like.

Particularly, when a case in which the amount of the fluorescent body used is reduced in terms of costs or a case in which fluorescent bodies are disposed in a focused manner around the light-emitting element so as to increase the light conversion efficiency is taken into account, it is preferable to add the fluorescent body to the first sealing layer in the second aspect. The content of the fluorescent body is preferably 5% by mass or more and 80% by mass or less and more preferably 20% by mass or more and 70% by mass or less of the mass of the first sealing layer. Meanwhile, it is also possible to add the fluorescent body to the second sealing layer.

In addition, in the photosemiconductor light emitting device of the present invention, it is also possible to jointly use a light scattering material with the fluorescent body in order to efficiently irradiate the fluorescent body with light emitted from the light-emitting element. In this case, it is preferable to add the light scattering material to the first sealing layer in which the fluorescent body is present. As the light scattering material, it is preferable to use a matrix resin forming the sealing layer, that is, particles having a different refractive index from the silicone resin forming the silicone resin composite, and the particle diameters thereof are preferably 20 nm or more at which Mie scattering-based light scattering occurs. Meanwhile, methods for mixing the light scattering material and the like are the same as those for the fluorescent body and thus will not be described.

As the above-described photosemiconductor light emitting device in which the light-emitting element and the fluorescent body are combined together, white light emitting diodes (for example, light emitting diodes in which an ultraviolet or blue light emitting diode and fluorescent body particles are combined together so as to eject white light) can be exemplified.

Meanwhile, in the above description, the alkenyl groups and the Si—H groups are used as the reactive functional group; however, regarding the alkenyl groups, at least a part thereof may be alkynyl groups. That is, at least a part of the alkenyl groups in (a) the alkenyl group-containing organopolysiloxane in (A) the curable silicone resin-forming component may be alkynyl groups, in (B) the surface-modified metal oxide particles, at least apart of the alkenyl groups as the reactive functional group in the surface-modifying material that is used for the surface modification of the metal oxide particles may be alkynyl groups, and, at least a part of the alkenyl groups as the reactive functional group in (C) the silicone compound having a reactive functional group may be alkynyl groups. This is because, even in a case in which alkynyl groups having a carbon-carbon triple bond (C≡C) are used instead of alkenyl groups having a carbon-carbon double bond (C═C), the reactivity or the use conditions barely change as long as the addition reaction is caused by the hydrosilylation reaction with the Si—H groups. Examples of the alkynyl group include an ethynyl group and a propanol group (propyl group).

Meanwhile, since the alkynyl groups and the Si—H groups react with each other at a ratio of 1:2 while the alkenyl groups and the Si—H groups react with each other at a ratio of 1:1, in a case in which the alkynyl groups are used instead of the alkenyl groups, the amount of the Si—H groups required increases. Therefore, in a case in which alkynyl groups are used as a part of the alkenyl groups instead of the alkenyl groups, it is preferable to obtain the numbers of the alkenyl groups and the alkynyl groups in (a) the alkenyl group (including alkynyl group)-containing organopolysiloxane, the surface-modifying material, and the silicone compound and set the total number of the Si—H groups in (b) the organohydrogenpolysiloxane, the surface-modifying material, and the silicone compound to be the same as [(the number of the alkenyl groups)×1+(the number of the alkynyl groups)×2] or approximately 1.1 to 1.2 times.

EXAMPLES

Hereinafter, the present invention will be specifically described using examples and comparative examples, but the present invention is not limited to these examples.

In the present examples, a variety of measurements and evaluations were carried out as described below.

(Average Primary Particle Diameter of Metal Oxide Particles)

As the average primary particle diameter of the metal oxide particles, a Scherrer diameter obtained by the calculation from a full width at half maximum of an X-ray diffraction peak was used. This is because, when the primary particle diameters have a nanometer size, a likelihood of one particle being constituted of a plurality of crystallites becomes low, and thus the average primary particle diameter becomes substantially equal to the Scherrer diameter.

(Viscosity of Curable Silicone Resin, Silicone Compound, and Curable Silicone Resin Composition)

The viscosities of the curable silicone resin and the like were measured using a rheometer (RHEOSTRESS RS-6000, manufactured by HAAKE Technik GmbH). Meanwhile, the viscosity was measured at a temperature of 25° C. and a shear velocity of 1.0 (1/s).

(Transmittance of Curable Silicone Resin Composition and Curable Silicone Resin Composite)

The transmittance of the curable silicone resin composition was measured by producing a specimen by inserting the curable silicone composition into a 0.5 mm thin layer silica cell and using an integrating sphere with a spectral photometer (V-570, manufactured by JASCO Corporation).

In addition, the transmittance of the silicone resin composite was measured by causing the curable silicone composition to flow on a glass substrate provided with a bank so that the thickness after being cured reached 0.5 mm, treating the film at 150° C. for six hours, and using an integrating sphere with a spectral photometer (V-570, manufactured by JASCO Corporation). Meanwhile, for the transmittances of the curable silicone resin composition and the silicone resin composite, values at a spectral wavelength of 460 nm were used as measurement values.

(Hardness of Silicone Resin Composite)

The hardness of the silicone resin composite was measured using a durometer (WR-104A and WR-105D, manufactured by Nishitokyo Seimitsu Co., Ltd.).

Example 1

(Production of Zirconia Particles)

Diluted ammonia water obtained by dissolving 344 g of 28% ammonia water in 20 L (liters) of pure water was added under stirring to a solution of a zirconium salt obtained by dissolving 2,615 g of zirconium oxychloride oxtahydrate in 40 L of pure water, thereby preparing a zirconia precursor slurry.

Next, an aqueous solution of sodium sulfate obtained by dissolving 300 g of sodium sulfate in 5 L of pure water was added under stirring to this slurry. The amount of sodium sulfate added at this time was 30% by mass of the zirconia equivalent of zirconium ions in the solution of a zirconium salt.

Next, this mixture was dried at 130° C. in the atmosphere for 24 hours using a dryer, thereby obtaining a solid substance.

Next, this solid substance was crushed using an automatic mortar and was then calcinated at 520° C. in the atmosphere for one hour using an electric furnace.

Next, this calcinated substance was injected into pure water, stirred into a slurry form, and then cleaned using a centrifugal separator, the added sodium sulfate was sufficiently removed, and then the substance was dried using the dryer, thereby obtaining zirconia particles having an average primary particle diameter of 5.5 nm.

(Surface Modification of Zirconia Particles: Production of Surface-Modified Zirconia Particles)

Next, 170 g of toluene and 6 g of a methoxy group-containing methylphenyl silicone resin (manufactured by Shin-Etsu Chemical Co., Ltd., KR-9218) were added to 20 g of the zirconia particles and mixed together, a surface modification treatment was carried out for six hours using a beads mill, and then beads were removed. Next, 4 g of vinyltrimethoxysilane (manufactured by Shin-Etsu Chemical Co., Ltd., KBM-1003) was added thereto, and a modification and dispersion treatment was carried out under recirculation at 130° C. for six hours, thereby preparing a zirconia transparent dispersion.

(Production of Curable Silicone Resin Composition)

9.4 g (1.9 g of an A liquid and 7.5 g of a B liquid) of a phenylsilicone resin (manufactured by Dow Corning Toray Co., Ltd., OE-6630, A liquid/B liquid blending ratio: 1/4, viscosity: 2.0 Pa·s) which is the (A) component was added to 66.7 g of the zirconia transparent dispersion, furthermore, 0.6 g of polyphenyl-dimethylhydroxysiloxane (manufactured by Gelest, Inc., HDP-111, viscosity: 0.08 Pa·s) which is the (C) component was added thereto and stirred, and then toluene was removed by means of drying under reduced pressure, thereby obtaining a curable silicone resin composition (content of surface-modified zirconia particles: 50% by mass, viscosity: 10 Pa·s) containing the surface-modified zirconia particles, the phenylsilicone resin, the polyphenyl-dimethylhydroxysiloxane, and a reaction catalyst. The transmittance of this curable silicone resin composition was 85%.

(Production of Silicone Resin Composite)

The curable silicone resin composition was thermally treated at 150° C. for three hours and thus cured, thereby obtaining a silicone resin composite.

A variety of evaluations described above were carried out using this silicone resin composite.

Example 2

(Production of Zirconia Particles)

Zirconia particles having an average primary particle diameter of 7.8 nm were produced in the same manner except for the fact that, in the production of the zirconia particles of Example 1, the calcination in the electric furnace was carried out at 550° C. in the atmosphere.

(Surface Modification of Zirconia Particles: Production of Surface-Modified Zirconia Particles)

Next, 170 g of toluene and 6 g of a methoxy group-containing methylphenyl silicone resin (manufactured by Shin-Etsu Chemical Co., Ltd., KR-9218) were added to 20 g of the zirconia particles and mixed together, a surface modification treatment was carried out for six hours using a beads mill, and then beads were removed. Next, 4 g of dimethoxymethylsilane (manufactured by Tokyo Chemical Industry Co., Ltd., D2100) was added thereto, and a modification and dispersion treatment was carried out under recirculation at 130° C. for six hours, thereby preparing a zirconia transparent dispersion.

(Production of Curable Silicone Resin Composition and Silicone Resin Composite)

5.4 g (1.1 g of an A liquid and 4.3 g of a B liquid) of a phenylsilicone resin (manufactured by Dow Corning Toray Co., Ltd., OE-6630, A liquid/B liquid blending ratio: 1/4, viscosity: 2.0 Pa·s) which is the (A) component was added to 93.3 g of the zirconia transparent dispersion, furthermore, 0.6 g of vinyl-terminated polydimethylsiloxane (manufactured by Gelest, Inc., DMS-V21, viscosity: 0.08 Pa·s) which is the (C) component was added thereto and stirred, and then toluene was removed by means of drying under reduced pressure, thereby obtaining a curable silicone resin composition (content of surface-modified zirconia particles: 70% by mass, viscosity: 5.0 Pa·s) containing the surface-modified zirconia particles, the phenylsilicone resin, the vinyl-terminated polysiloxane, and a reaction catalyst. The transmittance of this curable silicone resin composition was 76%.

A silicone resin composite was produced in the same manner as in Example 1 using this curable silicone resin composition, and a variety of evaluations described above were carried out.

Examples 3 to 6

Four kinds of curable silicone resin compositions were produced in the same manner as in Example 1 except for the fact that the zirconia transparent dispersion in Example 1 was used and, as the silicone compound which is the (C) component, compounds shown in Table 1 were respectively blended so as to obtain the contents shown in the table.

Meanwhile, the silicone compounds that were used in the respective examples are as described below.

Example 3: Polymethylhydrosiloxane (manufactured by Gelest, Inc., HMS-993, viscosity: 0.05 Pa·s)

Example 4: Methylhydrosiloxane-dimethylsiloxane copolymer (manufactured by Gelest, Inc., HMS-082, viscosity: 0.15 Pa·s)

Examples 5 and 6: Methylhydrosiloxane-phenylmethylsiloxane copolymer (manufactured by Gelest, Inc., HPM-502, viscosity: 0.08 Pa·s)

The four kinds of curable silicone resin compositions described above were respectively used, silicone resin composites were produced in the same manner as in Example 1, and a variety of evaluations described above were carried out.

Example 7

A curable silicone resin composition was produced in the same manner as in Example 1 except for the fact that the zirconia transparent dispersion in Example 1 was used and 9.4 g (3.13 g of an A liquid and 6.27 g of a B liquid) of a phenylsilicone resin (manufactured by Dow Corning Toray Co., Ltd., OE-6636, A liquid/B liquid blending ratio: 1/2, viscosity: 7.5 Pa·s) which is the (A) component was used.

A silicone resin composite was produced in the same manner as in Example 1 using this curable silicone resin composition, and a variety of evaluations described above were carried out.

Example 8

A curable silicone resin composition was produced in the same manner as in Example 1 except for the fact that the zirconia transparent dispersion in Example 1 was used and 9.6 g (4.8 g of an A liquid and 4.8 g of a B liquid) of a phenylsilicone resin (manufactured by Shin-Etsu Chemical Co., Ltd., SCR-1016, A liquid/B liquid blending ratio: 1/1, viscosity: 0.35 Pa·s) which is the (A) component was used, and the amount of polyphenyl-dimethylhydroxysiloxane (manufactured by Gelest, Inc., HDP-111, viscosity: 0.08 Pa·s) which is the (C) component used was set to 0.4 g.

A silicone resin composite was produced in the same manner as in Example 1 using this curable silicone resin composition, and a variety of evaluations described above were carried out.

Example 9

(Production of Silica Particles)

20 g of ammonia water having a concentration of 24%, 0.8 g of 10 N—NaOH, and, as a surfactant, 4 g of polyoxyethylene alkyl ether (trade name: EMERGEN 707, manufactured by Kao Corporation) were mixed into 80 g of methanol. 4 g of tetraethyl silicate diluted with methanol (trade name: ETHYLSILICATE 28, manufactured by Colcoat Co., Ltd.) was added dropwise thereto. The liquid mixture was stirred at 20° C. for one hour. After the end of the stirring, sediment was removed by means of decantation, the components were re-dispersed in methanol, and a decantation operation was repeated. The obtained wet silica particles were dried under reduced pressure so as to dry methanol, thereby obtaining generated silica particles. The average primary particle of the obtained silica particle diameters was 10 nm.

(Surface Modification of Silica Particles: Production of Surface-Modified Silica Particles)

Next, 170 g of toluene and 6 g of a methoxy group-containing methylphenyl silicone resin (manufactured by Shin-Etsu Chemical Co., Ltd., KR-9218) were added to 20 g of the silica particles and mixed together, a surface modification treatment was carried out for six hours using a beads mill, and then beads were removed. Next, 4 g of vinyltrimethoxysilane (manufactured by Tokyo Chemical Industry Co., Ltd., D2100) was added thereto, and a modification and dispersion treatment was carried out under recirculation at 130° C. for six hours, thereby preparing a silica transparent dispersion.

(Production of Curable Silicone Resin Composition and Silicone Resin Composite)

11.4 g (2.3 g of an A liquid and 9.1 g of a B liquid) of a phenylsilicone resin (manufactured by Dow Corning Toray Co., Ltd., OE-6630, A liquid/B liquid blending ratio: 1/4, viscosity: 2.0 Pa·s) which is the (A) component was added to 53.3 g of the silica transparent dispersion, furthermore, 0.6 g of vinylmethylsiloxane (manufactured by Gelest, Inc., VMS-T11, viscosity: 0.011 Pa·s) which is the (C) component was added thereto and stirred, and then toluene was removed by means of drying under reduced pressure, thereby obtaining a curable silicone resin composition (content of surface-modified silica particles: 40% by mass, viscosity: 1.0 Pa·s) containing the surface-modified silicon dioxide particles, the phenylsilicone resin, a vinylmethylsiloxane homopolymer, and a reaction catalyst. The transmittance of this curable silicone resin composition was 75%.

A silicone resin composite was produced in the same manner as in Example 1 using this curable silicone resin composition, and a variety of evaluations described above were carried out.

Comparative Example 1

A curable silicone resin composition and, furthermore, a silicone resin composite were produced in the same manner as in Example 1 except for the fact that, in the production of the curable silicone resin composition of Example 1, 10.0 g of a phenylsilicone resin (manufactured by Dow Corning Toray Co., Ltd., OE-6630, A liquid/B liquid blending ratio: 1/4, viscosity: 2.0 Pa·s) which is the (A) component was used, and the polyphenyl-dimethylhydroxysiloxane which is the (C) component was not used, and the same evaluations were carried out.

Comparative Example 2

(Production of Zirconia Particles and Surface-Modified Zirconia Particles)

A surface modification was carried out in the same manner as in Example 1 except for the fact that, in the production of the surface-modified zirconia particles of Example 1, amount of toluene was changed to 175 g and the surface-modifying material was changed to 5 g of methyltrimethoxysilane (manufactured by Shin-Etsu Chemical Co., Ltd., KBM-13), and a zirconia transparent dispersion was prepared.

(Production of Curable Silicone Resin Composition and Silicone Resin Composite)

9.4 g (1.9 g of an A liquid and 7.5 g of a B liquid) of a phenylsilicone resin (manufactured by Dow Corning Toray Co., Ltd., OE-6630, A liquid/B liquid blending ratio: 1/4, viscosity: 2.0 Pa·s) which is the (A) component was added to 80 g of the zirconia transparent dispersion, furthermore, 0.6 g of dimethylpolysiloxane (manufactured by Shin-Etsu Chemical Co., Ltd., KF-96-100cs, viscosity: 0.08 Pa·s) which is the (C) component was added thereto and stirred, and then toluene was removed by means of drying under reduced pressure, thereby obtaining a curable silicone resin composition (content of surface-modified zirconia particles: 50% by mass, viscosity: 10 Pa·s) containing the surface-modified zirconia particles, the phenylsilicone resin, the dimethylpolysiloxane, and a reaction catalyst. The transmittance of this curable silicone resin composition was 38%.

A silicone resin composite was produced in the same manner as in Example 1 using this curable silicone resin composition, and a variety of evaluations described above were carried out.

Comparative Example 3

(Production of Zirconia Particles)

Zirconia particles having an average primary particle diameter of 2.1 nm were produced in the same manner except for the fact that, in the production of the zirconia particles of Example 1, the calcination in the electric furnace was carried out at 500° C. in the atmosphere.

(Surface Modification of Zirconia Particles: Production of Surface-Modified Zirconia Particles)

Next, 170 g of toluene and 6 g of a methoxy group-containing methylphenyl silicone resin (manufactured by Shin-Etsu Chemical Co., Ltd., KR-9218) were added to 20 g of the zirconia particles and mixed together, a surface modification treatment was carried out for six hours using a beads mill, and then beads were removed. Next, 4 g of vinyltrimethoxysilane (manufactured by Shin-Etsu Chemical Co., Ltd., KBM-1003) was added thereto, and a modification and dispersion treatment was carried out under recirculation at 130° C. for six hours, thereby preparing a zirconia transparent dispersion.

(Production of Curable Silicone Resin Composition and Silicone Resin Composite)

7.0 g (1.4 g of an A liquid and 5.6 g of a B liquid) of a phenylsilicone resin (manufactured by Dow Corning Toray Co., Ltd., OE-6630, A liquid/B liquid blending ratio: 1/4, viscosity: 2.0 Pa·s) which is the (A) component was added to 66.7 g of the zirconia transparent dispersion, furthermore, 3.0 g of polymethylhydrosiloxane (manufactured by Gelest, Inc., HMS-992, viscosity: 0.03 Pa·s) which is the (C) component was added thereto and stirred, and then toluene was removed by means of drying under reduced pressure, thereby obtaining a curable silicone resin composition (content of surface-modified zirconia particles: 50% by mass, viscosity: 550 Pa·s) containing the surface-modified zirconia particles, the phenylsilicone resin, the polymethylhydrosiloxane, and a reaction catalyst. The transmittance of this curable silicone resin composition was 97%.

A silicone resin composite was produced in the same manner as in Example 1 using this curable silicone resin composition, and a variety of evaluations described above were carried out.

Comparative Example 4

Zirconia particles having an average primary particle diameter of 15 nm were produced in the same manner as in Example 1 except for the fact that, in the production of the zirconia particles of Example 1, the temperature of the calcination in the electric furnace was changed from 520° C. to 600° C. in the atmosphere. A curable silicone resin composition and, furthermore, a silicone resin composite were produced in the same manner as in Example 1 except for the fact that the zirconia particles were used, and a variety of evaluations described above were carried out.

Comparative Examples 5 to 8

Four kinds of curable silicone resin compositions were produced in the same manner as in Example 1 except for the fact that the zirconia transparent dispersion in Example 1 was used and, as the silicone compound which is the (C) component, compounds shown in Table 1 were respectively blended so as to obtain the contents shown in the table.

Meanwhile, the silicone compounds that were used in the respective comparative examples are as described below.

Comparative Example 5: Polydimethylsiloxane (manufactured by Gelest, Inc., DMS-H11, viscosity: 0.008 Pa·s)

Comparative Example 6: Polydimethylsiloxane (manufactured by Gelest, Inc., DMS-H25, viscosity: 0.3 Pa·s)

Comparative Example 7: Polymethylhydrosiloxane (manufactured by Gelest, Inc., HMS-992, viscosity: 0.03 Pa·s)

Comparative Example 8: Methylhydrosiloxane-dimethylsiloxane copolymer (manufactured by Gelest, Inc., HMS-082, viscosity: 0.15 Pa·s)

The four kinds of curable silicone resin compositions described above were respectively used, silicone resin composites were produced in the same manner as in Example 1, and a variety of evaluations described above were carried out.

The blending of the curable silicone resin compositions and the evaluation results of the silicone resin composites in the respective examples and comparative examples described above are summarized in Table 1.

TABLE 1

First Table

| | (A) component Viscosity (Pa·s) | (B) component | | | | (C) component | | | Viscosity of curable silicone resin composition (Pa·s) | Transmittance (curable silicone resin composition) (%) | Transmittance (silicone resin composite) (%) | Hardness |
|---|---|---|---|---|---|---|---|---|---|---|---|---|
| | | Metal oxide particles | Average primary particle diameter (nm) | Reactive functional group of surface-modifying material | Content (% by mass) | Reactive functional group of silicone compound | Viscosity (Pa·s) | Content (% by mass) | | | | |
| Example 1 | 2.0 | $ZrO_2$ | 5.5 | Alkenyl group | 50 | SiH group | 0.08 | 3.0 | 10 | 85 | 88 | 70 |
| Example 2 | 2.0 | $ZrO_2$ | 7.8 | SiH group | 70 | Alkenyl group | 0.08 | 3.0 | 5.0 | 76 | 79 | 80 |
| Example 3 | 2.0 | $ZrO_2$ | 5.5 | Alkenyl group | 50 | SiH group | 0.05 | 3.0 | 5.0 | 87 | 91 | 70 |
| Example 4 | 2.0 | $ZrO_2$ | 5.5 | Alkenyl group | 50 | SiH group | 0.15 | 3.0 | 60 | 81 | 84 | 70 |
| Example 5 | 2.0 | $ZrO_2$ | 5.5 | Alkenyl group | 50 | SiH group | 0.08 | 1.0 | 80 | 80 | 83 | 60 |
| Example 6 | 2.0 | $ZrO_2$ | 5.5 | Alkenyl group | 50 | SiH group | 0.08 | 13 | 1.0 | 87 | 91 | 80 |
| Example 7 | 7.5 | $ZrO_2$ | 5.5 | Alkenyl group | 50 | SiH group | 0.08 | 3.0 | 25 | 83 | 85 | 60 |
| Example 8 | 0.35 | $ZrO_2$ | 5.5 | Alkenyl group | 50 | SiH group | 0.08 | 2.0 | 1.5 | 84 | 90 | 90 |
| Example 9 | 2.0 | $SiO_2$ | 10 | SiH group | 40 | Alkenyl group | 0.011 | 3.0 | 1.0 | 75 | 78 | 50 |
| Comparative Example 1 | 2.0 | $ZrO_2$ | 5.5 | Alkenyl group | 50 | — | — | 0 | 210 | 85 | 88 | 55 |
| Comparative Example 2 | 2.0 | $ZrO_2$ | 5.5 | (Alkyl group) | 50 | (Trimethyl group) | 0.08 | 3.0 | 10 | 38 | 39 | 45 |
| Comparative Example 3 | 2.0 | $ZrO_2$ | 2.1 | Alkenyl group | 50 | SiH group | 0.03 | 15 | 550 | 97 | 99 | 90 |
| Comparative Example 4 | 2.0 | $ZrO_2$ | 15 | Alkenyl group | 50 | SiH group | 0.08 | 3.0 | 0.8 | 36 | 37 | 70 |
| Comparative Example 5 | 2.0 | $ZrO_2$ | 5.5 | Alkenyl group | 50 | SiH group | 0.008 | 3.0 | 0.5 | 85 | (Air bubbles generated) | — |

TABLE 1-continued

First Table

| | (A) component Viscosity (Pa·s) | Metal oxide particles | (B) component Reactive | | | (C) component | | | Viscosity of curable silicone resin composition (Pa·s) | Trans- mittance (curable silicone resin composition) (%) | Trans- mittance (silicone resin composite) (%) | Hard- ness |
|---|---|---|---|---|---|---|---|---|---|---|---|---|
| | | | Average primary particle diameter (nm) | functional group of surface- modifying material | Con- tent (% by mass) | Reactive functional group of silicone compound | Viscosity (Pa·s) | Con- tent (% by mass) | | | | |
| Comparative Example 6 | 2.0 | ZrO$_2$ | 5.5 | Alkenyl group | 50 | SiH group | 0.3 | 15 | 150 | 85 | 88 | 90 |
| Comparative Example 7 | 2.0 | ZrO$_2$ | 5.5 | Alkenyl group | 50 | SiH group | 0.03 | 0.4 | 190 | 85 | 88 | 50 |
| Comparative Example 8 | 2.0 | ZrO$_2$ | 5.5 | Alkenyl group | 50 | SiH group | 0.15 | 18 | 20 | 85 | (Cracks generated) | — |

The viscosity of the curable silicone resin compositions in Examples 1 to 9 was all 100 Pa·s or less, and there was no problem with the handling property for injection into packages. In addition, the transmittance of the curable silicone resin compositions was 75% or higher which was favorable, and the transmittance of the silicone resin composites that were obtained using these curable silicone resin compositions were also on the same level which was favorable. Furthermore, regarding the hardness of these silicone resin composites, the strength became higher compared with 43 which is a value in a case in which only OE-6636 which is a resin of the (A) component is cured, 33 which is a value in a case in which only OE-6630 is cured, and 70 which is a value in a case in which only SCR-1016 is cured, and favorable characteristics were exhibited.

On the other hand, in Comparative Examples 1, 3, 6, and 7 in which the silicone compound which is the (C) component was not included or the predetermined silicone compound was not used, the viscosity of the curable silicone resin compositions was high, and thus the handling property degraded, and, in Comparative Examples 2, 4, 5, and 8 in which the (C) component and the like did not have any reactive functional groups, the viscosity was too low, and the like, the characteristics of the silicone resin composites become poor, and the silicone resin composites were all not suitable for use as sealing materials and the like for photo-semiconductor light-emitting elements.

INDUSTRIAL APPLICABILITY

The present invention can be used not only as sealing materials for semiconductor light-emitting elements (LEDs and the like) but also as materials, members, and the like in a variety of other industrial fields.

The invention claimed is:

1. A curable silicone resin composition comprising:
    (A) a curable silicone resin-forming component of which a viscosity is 0.02 Pa·s or greater and 100 Pa·s or less;
    (B) surface-modified metal oxide particles which are surface-modified by a surface-modifying material having a reactive functional group and have an average primary particle diameter of 3 nm or more and 10 nm or less; and
    (C) a silicone compound having a reactive functional group of which a viscosity is less than the viscosity of the (A) component and is 0.01 Pa·s or greater and 1.0 Pa·s or less and having a content of 0.1% by mass or more and 15% by mass or less based on a total amount of the curable silicone resin composition,
    wherein a viscosity of the curable silicone resin composition is 1.0 Pa·s or greater and 100 Pa·s or less.

2. The curable silicone resin composition according to claim 1,
    wherein both the surface-modifying material and the silicone compound have one or more functional group selected from an alkenyl group and a Si—H group as the reactive functional group.

3. The curable silicone resin composition according to claim 1,
    wherein the curable silicone resin-forming component comprises (a) an alkenyl group-containing organopolysiloxane, (b) an organohydrogenpolysiloxane, and (c) a hydrosilylation catalyst.

4. A silicone resin composite formed by curing the curable silicon resin composition according to claim 1.

5. A photosemiconductor light emitting device,
    wherein a semiconductor light-emitting element is sealed with a sealing material, and the sealing material is made of the silicone resin composite according to claim 4.

6. A luminaire comprising:
    the photosemiconductor light emitting device according to claim 5.

7. A liquid crystal imaging device comprising:
    the photosemiconductor light emitting device according to claim 5.

* * * * *